（12）United States Patent
Lee et al.

(10) Patent No.: US 12,165,884 B2
(45) Date of Patent: Dec. 10, 2024

(54) SELF-ASSEMBLY APPARATUS AND METHOD FOR SEMICONDUCTOR LIGHT-EMITTING DEVICES

(71) Applicant: LG ELECTRONICS INC., Seoul (KR)

(72) Inventors: Hyunho Lee, Seoul (KR); Bongchu Shim, Seoul (KR); Gunho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 483 days.

(21) Appl. No.: 17/612,881

(22) PCT Filed: May 28, 2019

(86) PCT No.: PCT/KR2019/006392
§ 371 (c)(1),
(2) Date: Nov. 19, 2021

(87) PCT Pub. No.: WO2020/235732
PCT Pub. Date: Nov. 26, 2020

(65) Prior Publication Data
US 2022/0223437 A1   Jul. 14, 2022

(30) Foreign Application Priority Data
May 22, 2019   (KR) .................. 10-2019-0060212

(51) Int. Cl.
*H01L 33/00*   (2010.01)
*H01L 21/67*   (2006.01)
*H01L 25/075*  (2006.01)

(52) U.S. Cl.
CPC .... *H01L 21/67017* (2013.01); *H01L 25/0753* (2013.01); *H01L 33/007* (2013.01); *H01L 33/0075* (2013.01); *H01L 33/0093* (2020.05)

(58) Field of Classification Search
None
See application file for complete search history.

(56) References Cited

U.S. PATENT DOCUMENTS 6,780,696 B1 *  8/2004  Schatz .................... H01L 24/95
                                                        428/209
8,609,454 B2 * 12/2013  Dai ........................ H01L 24/95
                                                        29/739

(Continued)

FOREIGN PATENT DOCUMENTS

JP         2005-174979 A    6/2005
KR    10-2012-0045965 A     5/2012

(Continued)

*Primary Examiner* — Bradley Smith
(74) *Attorney, Agent, or Firm* — Birch, Stewart, Kolasch & Birch, LLP

(57) ABSTRACT

Discussed is a self-assembly apparatus for a plurality of semiconductor light-emitting devices, and a method for self-assembly of the plurality of semiconductor light-emitting devices, whereby the apparatus includes a chamber accommodating the plurality of semiconductor light-emitting devices and a fluid; a transferor to transfer a substrate to an assembly position; a magnet to apply a magnetic force to the plurality of semiconductor light-emitting devices; a position controller to control a position of the magnet; and a vibration generator in contact with the fluid to generate a vibration in the fluid to separate the plurality of semiconductor light-emitting devices from each other while in the fluid, wherein an electric field is produced in the substrate while the plurality of semiconductor light-emitting devices are moved according to a change of the position of the magnet.

18 Claims, 12 Drawing Sheets

(56) References Cited

U.S. PATENT DOCUMENTS

| | | | |
|---|---|---|---|
| 2007/0087472 A1 | 4/2007 | Huber et al. | |
| 2008/0023435 A1* | 1/2008 | Wu | H01L 25/50 257/E21.705 |
| 2016/0111408 A1 | 4/2016 | Karlicek, Jr. et al. | |
| 2017/0292214 A1* | 10/2017 | Scharf | D06F 19/00 |
| 2018/0102352 A1 | 4/2018 | Sasaki et al. | |
| 2019/0058085 A1 | 2/2019 | Ahmed et al. | |

FOREIGN PATENT DOCUMENTS

| KR | 10-2015-0006798 A | 1/2015 |
|---|---|---|
| KR | 10-2018-0030464 A | 3/2018 |
| KR | 10-2019-0017691 A | 2/2019 |

\* cited by examiner

SELF-ASSEMBLY APPARATUS AND METHOD FOR SEMICONDUCTOR LIGHT-EMITTING DEVICES

CROSS REFERENCE TO RELATED APPLICATIONS

This application is the National Phase of PCT International Application No. PCT/KR2019/006392, filed on May 28, 2019, which claims priority under 35 U.S.C. § 119(a) to Patent Application No. 10-2019-0060212, filed in the Republic of Korea on May 22, 2019, all of these applications being hereby expressly incorporated by reference into the present application.

TECHNICAL FIELD

The present disclosure relates to a display device and a method for manufacturing the same, and more particularly, to a self-assembly apparatus and method for a semiconductor light-emitting device with a size of several to several tens of μm.

BACKGROUND

The current competing technologies for large area display are liquid crystal displays (LCDs), organic light-emitting diode (OLED) displays, micro-LED displays, and the like.

However, there exist problems such as not-so-fast response time and low efficiency of light generated by backlight in the case of the LCDs, and there exist drawbacks such as a short lifespan, not-so-good yield, and low efficiency in the case of the OLEDs.

The use of semiconductor light-emitting diodes (micro-LEDs (μLEDs)) with a diameter or cross-sectional area of 100 microns or less in a display may provide very high efficiency because the display does not use a polarizer to absorb light. However, since a large display requires millions of LEDs, it has difficulty in transferring the LEDs compared to other technologies.

Pick and place, laser lift-off (LLO), self-assembly, and the like have been developed for transfer techniques. Among them, the self-assembly technique, which is a method in which semiconductor light-emitting diodes are self-organized in a fluid, is the most suitable method for realizing a large screen display device.

In relation to the self-assembly technique, various methods for improving the assembly speed and accuracy by controlling distribution and movement of semiconductor light-emitting diodes in a fluid have been discussed recently.

SUMMARY

The present disclosure is directed to solving the above-described problems. The present disclosure describes a self-assembly apparatus and method for semiconductor light-emitting devices capable of separating semiconductor light-emitting devices adhered to each other during the self-assembly, and generating a flow of fluid according to a movement direction of a magnet.

According to one aspect of the subject matter described in this application, a self-assembly apparatus for semiconductor light-emitting devices includes: a chamber in which a plurality of semiconductor light-emitting devices each including a magnetic material, and a fluid are accommodated; a transfer unit configured to transfer a substrate on which the semiconductor light-emitting devices are assembled to an assembly position; a magnet disposed to be spaced apart from the chamber to apply a magnetic force to the semiconductor light-emitting devices; a position controller connected to the magnet and configured to control a position of the magnet; and a vibration generator disposed such that at least a portion thereof is in contact with the fluid to generate vibration in the fluid, so as to separate the semiconductor light-emitting devices from each other. An electric field may be produced in the substrate to allow the semiconductor light-emitting devices to be assembled at predetermined positions of the substrate while moving according to a change of the position of the magnet.

Implementations according to this aspect may include one or more of the following features. For example, the substrate may be disposed at the chamber such that an assembly surface thereof on which the semiconductor light-emitting devices are assembled faces downward, and at least a portion of the substrate may be immersed in the fluid.

In some implementations, the substrate may include a plurality of electrodes extending in one direction, and an electric field may be produced in the substrate when power is applied to the plurality of electrodes.

In some implementations, the vibration generator may be provided at each of both sides of the substrate to be adjacent to the substrate.

In some implementations, the vibration generator may generate vibration in the fluid before the substrate is transferred to the assembly position.

In some implementations, the chamber may accommodate a fluid to which a surfactant is added.

In some implementations, a channel communicating with a space in the chamber may be formed, and the channel may generate a flow of the fluid in the chamber in association with movement of the magnet.

According to another aspect, a method for self-assembling semiconductor light-emitting devices is provided. The method may include the steps of: putting a plurality of semiconductor light-emitting devices each including a magnetic material into a chamber in which a fluid is accommodated; transferring a substrate on which the semiconductor light-emitting devices are assembled to an assembly position; applying a magnetic force to the semiconductor light-emitting devices to allow the semiconductor light-emitting devices to move in the chamber along one direction; applying an electric field to the substrate to guide the semiconductor light-emitting devices to predetermined positions such that the semiconductor light-emitting devices are assembled at the predetermined positions of the substrate while moving; and generating vibration in the fluid to separate the semiconductor light-emitting devices from each other before the substrate is transferred to the assembly position.

Implementations according to this aspect may include one or more following features. For example, the substrate may be disposed at the chamber such that an assembly surface thereof on which the semiconductor light-emitting devices are assembled faces downward, and at least a portion of the substrate may be immersed in the fluid.

In some implementations, the semiconductor light-emitting devices may move in a direction in which the magnetic force is applied, and the method may further include generating a flow of the fluid in the chamber in a direction in which the magnetic force is applied.

In a self-assembly apparatus and method for semiconductor light-emitting devices according to implementations of the present disclosure, as a vibration generator disposed to be in contact with a fluid generates vibration in a fluid, semiconductor light-emitting devices adhered to each other in the fluid can be separated from each other, thereby preventing two or more semiconductors from being assembled into one cell.

In particular, as the vibration generator generates vibration before an assembly substrate is transferred to an assembly position, the semiconductor light-emitting devices can be present while being separated from each other in the fluid before the self-assembly, and minimize the influence of vibration during the self-assembly.

In addition, a flow of the fluid can be generated in a direction in which the magnet moves through a channel communicating with a space in the chamber in which the fluid is accommodated to thereby assist the movement of the semiconductor light-emitting devices.

DETAILED DESCRIPTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. It will be understood that when an element such as a layer, area or substrate is referred to as being "on" another element, it can be directly on the element, or one or more intervening elements may also be present.

A display device disclosed herein may include a mobile phone, a smart phone, a laptop computer, a digital broadcast terminal, a personal digital assistant (PDA), a portable multimedia player (PMP), a navigator, a slate PC, a tablet PC, an ultrabook, a digital TV, a desktop computer, and the like. However, it would be readily apparent to those skilled in the art that the configuration according to the implementations described herein may also be applied to a new product type of display device that will be developed later.

Figure 1:
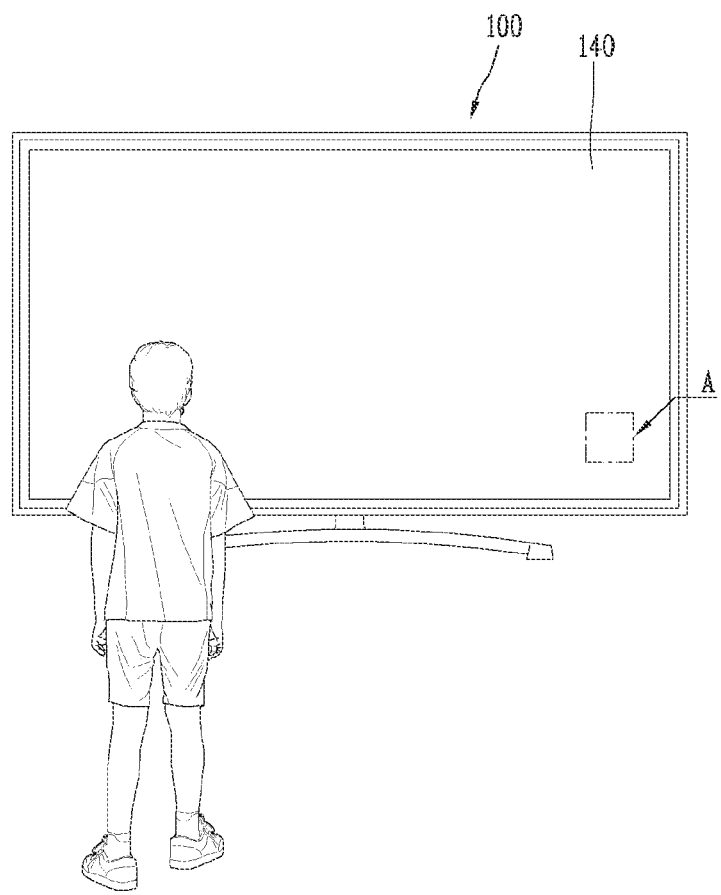
FIG. 1 is a conceptual view illustrating a display device using a semiconductor light-emitting device (diode) according to one implementation of the present disclosure.
Figure 2:
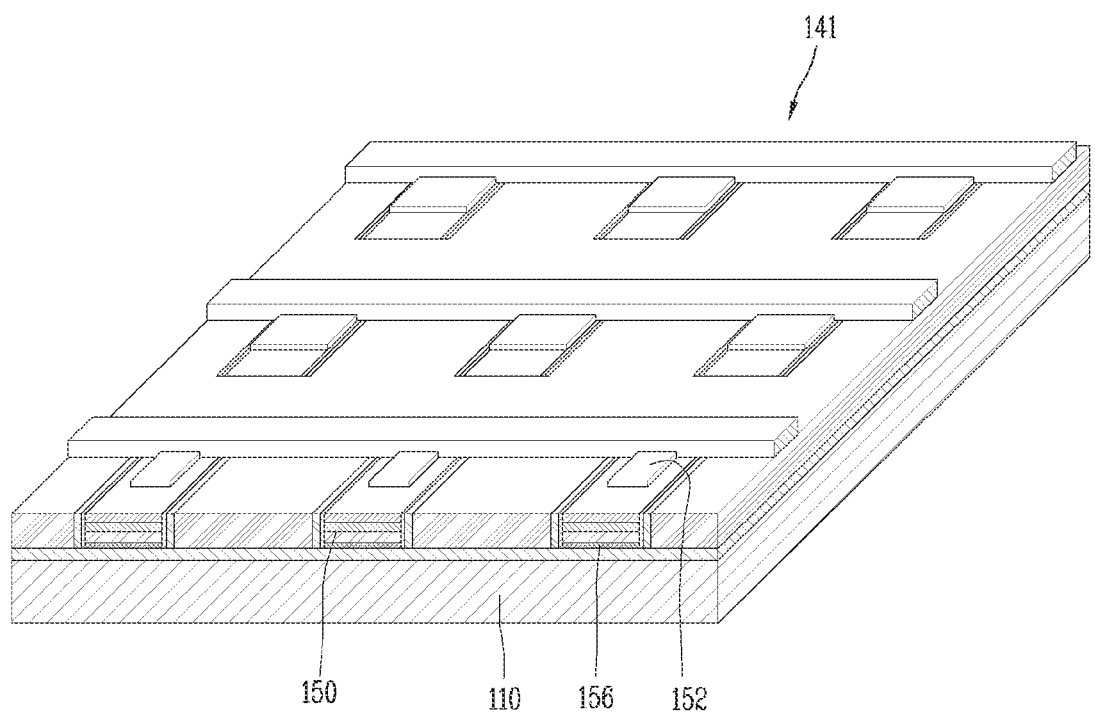
FIG. 2 is an enlarged view illustrating a portion "A" of the display device in FIG. 1.
Figure 3:
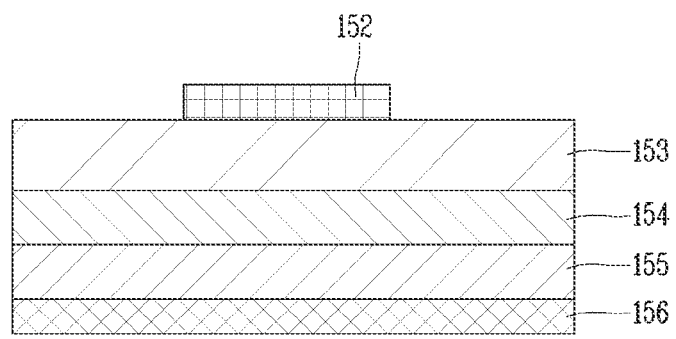
FIG. 3 is an enlarged view of a semiconductor light-emitting device of FIG. 2.
Figure 4:
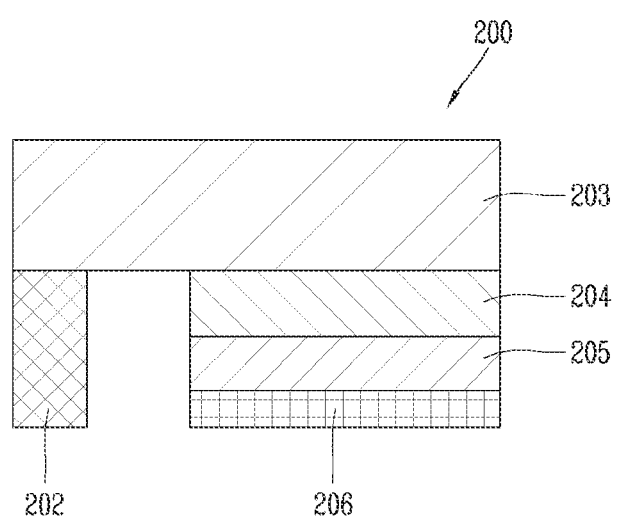
FIG. 4 is an enlarged view illustrating another example of a semiconductor light-emitting device of FIG. 2.

FIG. 1 is a conceptual view illustrating a display device using a semiconductor light-emitting device according to one implementation of the present disclosure, FIG. 2 is an enlarged view of a portion "A" of the display device in FIG. 1, FIG. 3 is an enlarged view of a semiconductor light-emitting device of FIG. 2, and FIG. 4 is an enlarged view illustrating another example of the semiconductor light-emitting device of FIG. 2.

As illustrated, information processed in a control unit (or controller) of a display device 100 may be displayed on a display module 140. A case with a closed-loop shape surrounding an edge of the display module 140 may form a bezel of the display device 100.

The display module 140 may include a panel 141 on which an image is displayed, and the panel 141 may include semiconductor light-emitting devices 150 with a micro size and a wiring substrate (or board) 110 on which the semiconductor light-emitting devices 150 are mounted.

A wiring is formed on the wiring substrate 110 so as to be connected to an n-type electrode 152 and a p-type electrode 156 of the semiconductor light-emitting device 150. This may allow the semiconductor light-emitting devices 150 to be provided on the wiring substrate 110 as self-emitting individual pixels.

An image displayed on the panel 141 is visual information, which is achieved by independently controlling light emission of sub-pixels arranged in the form of matrix through the wiring.

The present disclosure exemplarily illustrates a micro light-emitting diode (micro-LED) as one type of the semiconductor light-emitting device 150 that converts current into light. The micro-LED may be a light-emitting diode with a small size of 100 microns or less. The semiconductor light-emitting devices 150 may be provided in blue, red, and green light-emitting regions, respectively, to define a sub-pixel by a combination thereof. That is, the sub-pixel denotes a minimum unit for realizing one color, and at least three micro-LEDs may be provided in the sub-pixel.

More specifically, the semiconductor light-emitting device 150 may have a vertical structure as illustrated in FIG. 3.

For example, each of the semiconductor light-emitting devices 150 may be implemented as a high-power light-emitting device that emits various light colors including blue in a manner that gallium nitride (GaN) is mostly used, and indium (In) and/or aluminum (Al) are added thereto.

The vertical type semiconductor light-emitting device may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. Here, the p-type electrode 156 located at the bottom may be electrically connected to a p-electrode of the wiring substrate 110, and the n-type electrode 152 located at the top may be electrically connected to an n-electrode at an upper side of the semiconductor light-emitting device. The electrodes may be disposed in an up and down direction in the vertical type semiconductor light-emitting device 150 to thereby provide a great advantage of reducing the chip size.

Alternatively, referring to FIG. 4, the semiconductor light-emitting device may be a flip chip type light-emitting device.

For example, a semiconductor light-emitting device 200 may include a p-type electrode 206, a p-type semiconductor layer 205 on which the p-type electrode 206 is formed, an active layer 204 formed on the p-type semiconductor layer 205, an n-type semiconductor layer 203 formed on the active layer 204, and an n-type electrode 202 disposed on the n-type semiconductor layer 203 with being spaced apart from the p-type electrode 206 in a horizontal direction. Here, both the p-type electrode 206 and the n-type electrode 202 may be electrically connected to the p-electrode and the n-electrode of the wiring substrate 110 at the bottom of the semiconductor light-emitting device 250.

Each of the vertical type semiconductor light-emitting device and the horizontal type semiconductor light-emitting device may be a green semiconductor light-emitting device, a blue semiconductor light-emitting device, or a red semiconductor light-emitting device. The green semiconductor light-emitting device and the blue semiconductor light-emitting device may each be implemented as a high-power light-emitting device that emits green or blue light in a manner that gallium nitride (GaN) is mostly used, and indium (In) and/or aluminum (Al) are added thereto. As an example, the semiconductor light-emitting device may be a gallium nitride thin film consisting of various layers such as n-Gan, p-Gan, AlGaN, InGan, and the like. More specifically, the p-type semiconductor layer may be P-type GaN, and the n-type semiconductor layer may be N-type GaN. In the case of the red semiconductor light-emitting device, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the semiconductor light-emitting devices described above may be semiconductor light-emitting devices without an active layer.

Referring to FIGS. 1 to 4, since the light-emitting diode is very small, the display panel may be configured such that self-emitting sub-pixels are arranged at fine pitch, thereby achieving a high-definition display device.

In a display device using the semiconductor light-emitting devices of the present disclosure, a semiconductor light-emitting device grown on a wafer and formed by mesa and isolation is used as an individual pixel. Here, the semiconductor light-emitting device 150 with the micro size should be transferred onto the wafer at a predetermined position on the substrate of the display panel. Pick and place is one example of those transfer techniques, which has a low success rate and requires much time. As another example, a technique of transferring several devices at once using a stamp or a roll can be used, which is poor in yield and is not suitable for a large screen display. Therefore, the present disclosure provides a new method for manufacturing a display device that can solve these problems and a manufacturing device therefor.

A new method for manufacturing a display device will be described first. FIGS. 5A to 5E are conceptual views illustrating a new process of fabricating the semiconductor light-emitting device.

The present disclosure exemplarily illustrates a display device using a passive matrix (PM) type semiconductor light-emitting device. However, an example described hereinafter may also be applied to an active matrix (AM) type semiconductor light-emitting device. In addition, the present disclosure exemplarily illustrates self-assembly of horizontal semiconductor light-emitting devices, but it is equally applicable to self-assembly of vertical semiconductor light-emitting devices.

Figure 5A:
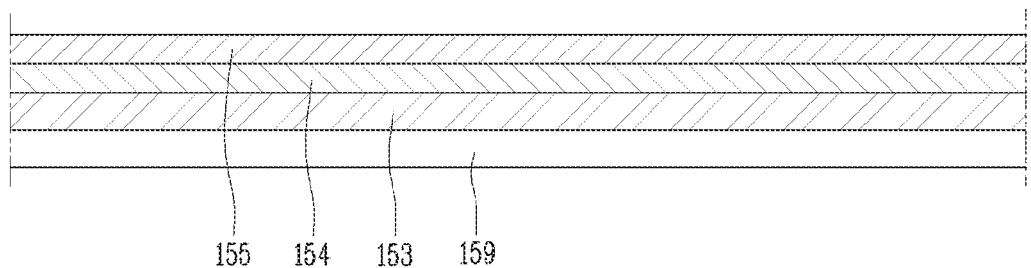
FIGS. 5A to 5E are conceptual views illustrating a new process of fabricating the semiconductor light-emitting device.

According to a manufacturing method, a first conductive semiconductor layer 153, an active layer 154, and a second conductive semiconductor layer 155 are grown on a growth substrate 159 (FIG. 5A).

When the first conductive semiconductor layer 153 is grown, the active layer 154 is grown on the first conductive semiconductor layer 153, then the second conductive semiconductor layer 155 is grown on the active layer 154. As such, when the first conductive semiconductor layer 153, the active layer 154, and the second conductive semiconductor layer 155 are sequentially grown, the first conductive semiconductor layer 153, the active layer 154, and the second conductive semiconductor layer 155 form a layered structure as illustrated in FIG. 5A.

Here, the first conductive semiconductor layer 153 may be a p-type semiconductor layer, and the second conductive semiconductor layer 155 may be an n-type semiconductor layer. However, the present disclosure is not necessarily limited thereto, and the first conductive semiconductor layer 153 may be an n-type semiconductor layer, and the second conductive semiconductor layer 155 may be a p-type semiconductor layer.

In addition, this implementation exemplarily illustrates a case in which the active layer 154 is present. However, in some cases, a structure without the active layer 154 is also possible as described above. For example, the p-type semiconductor layer may be P-type GaN doped with Mg, and the n-type semiconductor layer may be N-type GaN doped with Si.

The growth substrate (wafer) 159 may be made of a material having optical transparency, such as sapphire ($Al_2O_3$), GaN, ZnO, and AlO, but the present disclosure is not limited thereto. In addition, the growth substrate 159 may be made of a material suitable for growing a semiconductor material, namely, a carrier wafer. The growth substrate 159 may be formed of a material having high thermal conductivity, and use, for example, a SiC substrate having higher thermal conductivity than a sapphire ($Al_2O_3$) substrate, or Si, GaAs, GaP, and InP, in addition to a conductive substrate or an insulating substrate.

Figure 5B:
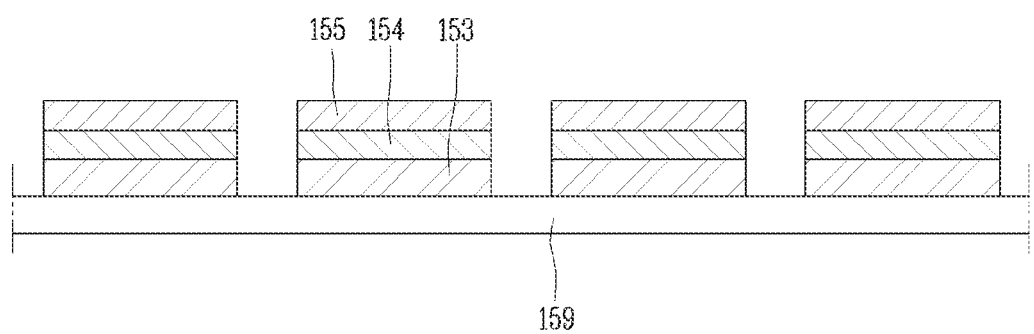

Next, at least portions or parts of the first conductive semiconductor layer 153, the active layer 154, and the second conductive semiconductor layer 155 are removed to form a plurality of semiconductor light-emitting devices (FIG. 5B).

More specifically, isolation is carried out such that the plurality of light-emitting devices form an array of semiconductor light-emitting devices. That is, the first conductive semiconductor layer 153, the active layer 154, and the second conductive semiconductor layer 155 are etched in a vertical direction to form a plurality of semiconductor light-emitting devices.

In case the horizontal type semiconductor light-emitting device is formed in this step, the active layer 154 and the second conductive semiconductor layer 155 may be partially removed in the vertical direction to perform a mesa process in which the first conductive semiconductor layer 153 is exposed to the outside, and then an isolation process in which the first conductive semiconductor layer 153 is etched to form a plurality of semiconductor light-emitting device arrays.

Figure 5C:
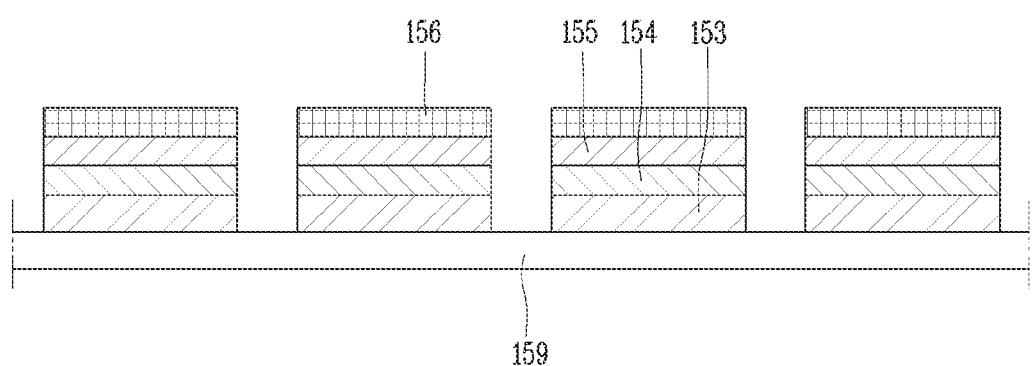

Next, a second conductive electrode 156 or p-type electrode is formed on one surface of each of the second conductive semiconductor layers 155 (FIG. 5C). The second conductive electrode 156 may be formed by a deposition method such as sputtering, but the present disclosure is not limited thereto. However, when the first conductive semiconductor layer 153 and the second conductive semiconductor layer 155 are an n-type semiconductor layer and a p-type semiconductor layer, respectively, the second conductive electrode 156 may be an n-type electrode.

Figure 5D:
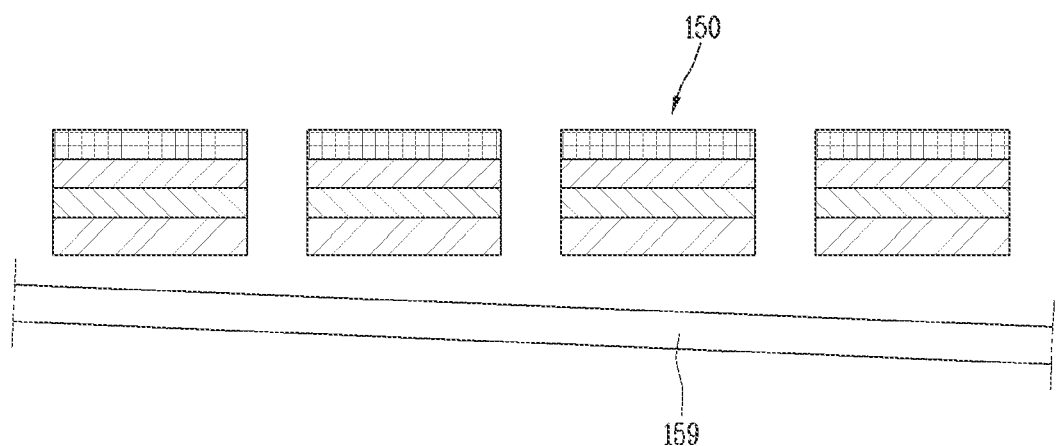

Then, the growth substrate 159 is removed to have the plurality of semiconductor devices. For example, the growth substrate 159 may be removed using a laser lift-off (LLO) or chemical lift-off (CLO) method (FIG. 5D).

Figure 5E:
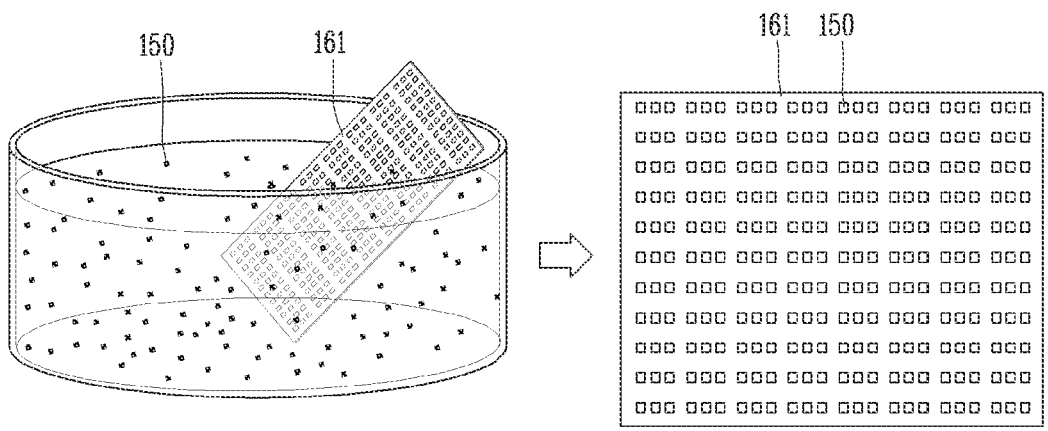

After that, a step of placing the plurality of semiconductor light-emitting devices 150 onto a substrate in a chamber filled with a fluid is performed (FIG. 5E).

For example, the semiconductor light-emitting devices 150 and a substrate 161 are put into a chamber filled with a fluid, such that the semiconductor light-emitting devices 150 are self-assembled onto the substrate 161 using the flow, gravity, surface tension, and the like. Here, the substrate 161 may be an assembly substrate.

As another example, a wiring substrate, instead of the assembly substrate, may be put into the fluid chamber to allow the semiconductor light-emitting devices 150 to be directly seated on the wiring substrate. In this case, the substrate may be a wiring substrate. However, for the sake of convenience of explanation, the present disclosure exemplarily illustrates the case in which the substrate 161 is an assembly substrate on which the semiconductor light-emitting devices 150 are seated.

In order to allow the semiconductor light-emitting devices 150 to be easily placed onto the substrate 161, the substrate 161 may be provided with cells (not shown) to which the semiconductor light-emitting devices 150 are fitted. In detail, the cells on which the semiconductor light-emitting devices 150 are placed are formed at the substrate 161 in positions where the semiconductor light-emitting devices 150 are aligned with wiring electrodes. The semiconductor light-emitting devices 150 are assembled to the cells while moving in the fluid.

After the plurality of semiconductor light-emitting devices 150 are arrayed on the assembly substrate 161, the semiconductor light-emitting devices 150 of the assembly substrate 161 are transferred onto a wiring substrate, enabling large-area transfer. Therefore, the assembly substrate 161 may be referred to as a temporary substrate.

Meanwhile, the self-assembly described above requires increased transfer efficiency and transfer yield to be applied to the manufacture of a large screen display. The present disclosure provides a self-assembly device and method for semiconductor light-emitting devices that can improve the assembly speed and assembly accuracy by controlling distribution and movement of semiconductor light-emitting devices in a fluid.

According to the present disclosure, semiconductor light-emitting devices including magnetic materials are used to cause the light-emitting devices to be moved by a magnetic force, and are placed at predetermined positions on a substrate by using an electric field while moving. Hereinafter, an apparatus and a method used for the self-assembly will be described in detail with reference to the accompanying drawings.

Figure 6:
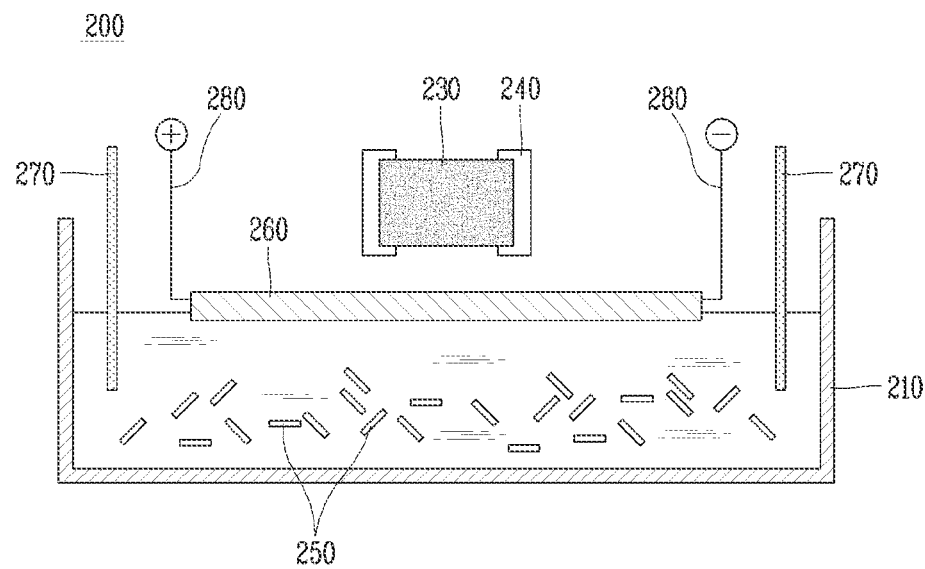
FIG. 6 illustrates a self-assembly apparatus for semiconductor light-emitting devices according to one implementation of the present disclosure.
Figure 7:
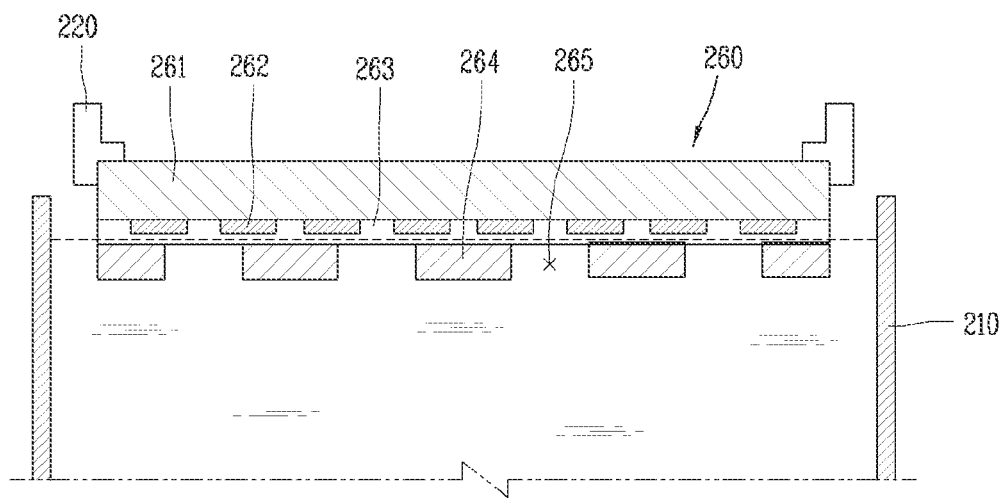
FIG. 7 illustrates an assembly surface of a substrate submerged in a fluid according to the present disclosure.
Figure 8A:
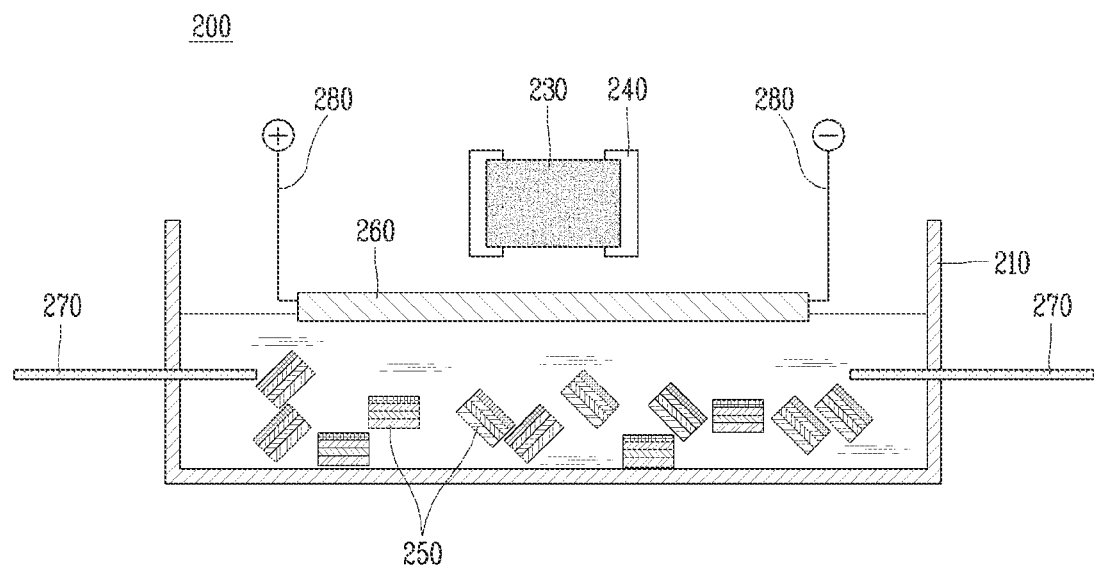
FIGS. 8A to 8C illustrate a self-assembly apparatus for semiconductor light-emitting devices according to another implementation of the present disclosure.
Figure 8B:
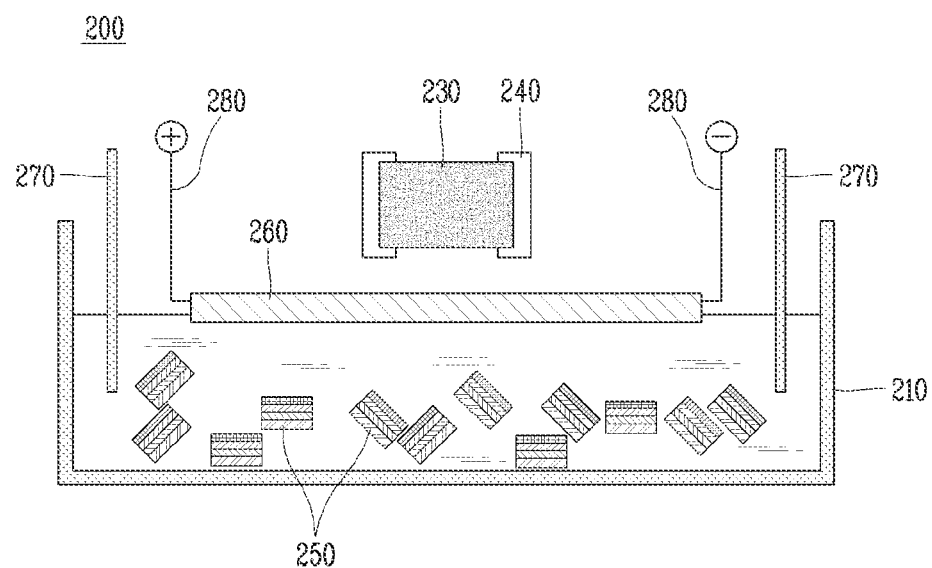
Figure 8C:
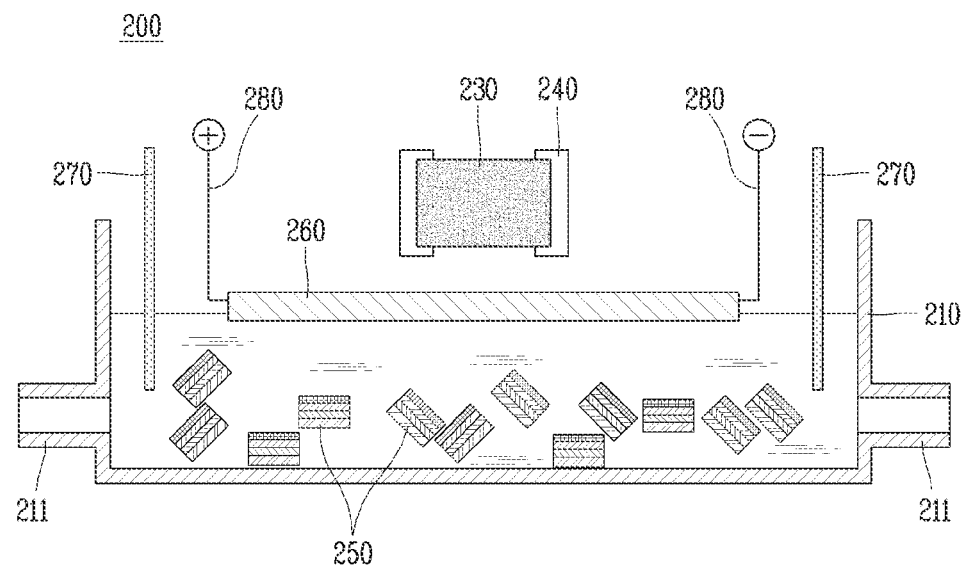
Figure 9:
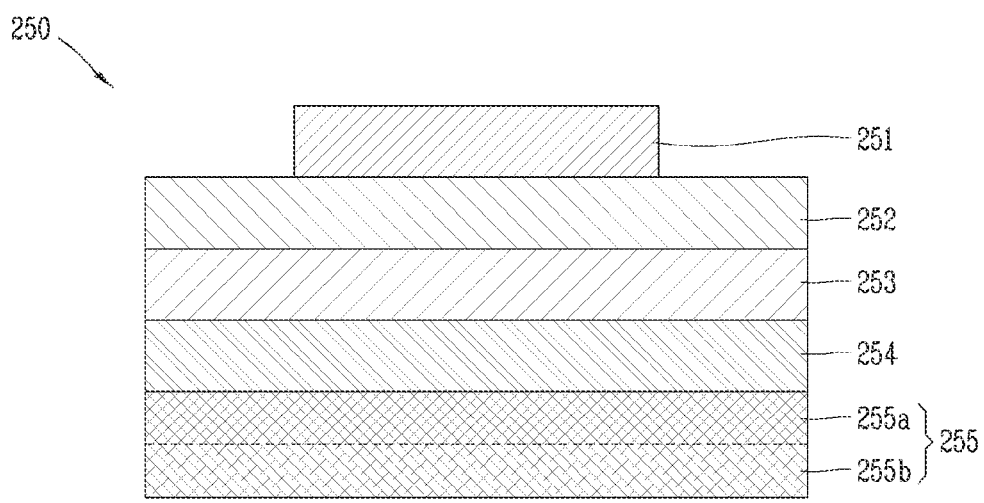
FIG. 9 is a conceptual view illustrating a semiconductor light-emitting device used for the self-assembly according to the present disclosure.

FIG. 6 illustrates a self-assembly apparatus for semiconductor light-emitting devices according to one implementation of the present disclosure, FIG. 7 illustrates an assembly surface of a substrate submerged in a fluid according to the present disclosure, and FIGS. 8A to 8C illustrate a self-assembly apparatus for semiconductor light-emitting devices according to another implementation of the present disclosure, and FIG. 9 is a conceptual view illustrating a semiconductor light-emitting device used for self-assembly according to the present disclosure.

A self-assembly apparatus or device (hereinafter, 'self-assembly apparatus') 200 according to one implementation of the present disclosure may include a chamber 210, a transfer unit 220, a magnet 230, a position controller (or location control unit) 240, and vibration generators (or vibration control units) 270.

The chamber 210 may be configured to accommodate a plurality of semiconductor light-emitting devices 250 including a magnetic material (or substance) 255a, and a fluid therein. For example, the chamber 210 may be a water tank with one side open, but is not limited thereto.

The fluid accommodated in the chamber 210 is an assembly solution, and may contain de-ionized water or a fluid to which a surfactant is added (or deionized water to which a surfactant is added), and a type of surfactant added to the fluid is not specifically limited. When a fluid containing a surfactant is used as the assembly solution, it is possible to prevent the semiconductor light-emitting devices 250 put into the chamber 210 from adhering or sticking to each other.

Meanwhile, a substrate 260 to which the semiconductor light-emitting devices 250 are assembled may be disposed at the one open side of the chamber 210. According to the implementation of the present disclosure, the substrate 260 may be disposed such that its assembly surface on which the semiconductor light-emitting devices 250 are assembled faces downward, namely, toward a bottom surface of the chamber 210. Also, as illustrated in FIG. 7, at least a portion of the substrate 260 may be submerged in the fluid, and the degree of submersion may vary according to the degree of bending of the substrate 260. However, for the self-assembly of the semiconductor light-emitting devices 250, cells 265 on which the semiconductor light-emitting devices 250 are seated may be completely immersed in the fluid.

The substrate 260 may be transferred to the assembly position by the transfer unit 220, and the position may be adjusted by the control unit (not shown). The transfer unit 220 may include a stage on which the substrate 260 is mounted and supported as shown in FIG. 7, and the substrate 260 may be fixed to the assembly position by the stage during the self-assembly.

Referring to FIG. 7, the substrate 260 may be an assembly substrate in which an electric field is produced, and may include a base portion 261, a plurality of electrodes 262, and a dielectric layer 263.

The base portion 261 is made of an insulating material, and the plurality of electrodes 262 may be thin films or bi-planar electrodes patterned on one surface of the base portion 261. The electrodes 262 may each extend in one direction, and be formed of a stack of Ti/Cu/Ti, silver (Ag) paste, indium tin oxide (ITO), or the like. Power may be applied to the plurality of electrodes 262 through a power supply unit 280. When power is applied to the plurality of electrodes 262, an electric field may be generated in the substrate 260.

The dielectric layer 263 may be configured to cover the plurality of electrodes 262, and be made of an inorganic material such as $SiO_2$, $SiN_x$, $SiON$, $Al_2O_3$, $TiO_2$, $HfO_2$, and the like. Alternatively, the dielectric layer 263 may be formed of a single-layer or multi-layered organic insulator. The dielectric layer 263 may have a thickness of several tens of nm to several μm.

Further, the substrate 260, which is a region in which the semiconductor light-emitting devices 250 are assembled, may include a plurality of cells 265 partitioned by partition walls 264. The cells 265 are sequentially disposed in one direction, and neighboring cells 265 may share a partition wall 264. The partition walls 264 may be provided on the dielectric layer 263. Therefore, the dielectric layer 263 may correspond to a bottom surface of the cells 265. The cells 265 divided by the partition walls 264 may form a matrix arrangement.

The semiconductor light-emitting devices 250 may be assembled into the plurality of cells 265, and one semiconductor light-emitting device 250 may be assembled into one cell 265. The cell 265 may have the same or similar shape as the semiconductor light-emitting device 250.

Meanwhile, a plurality of electrodes 262 may be provided below the cells 265, such that an electric field may be produced in the cells 265 when power is applied to the electrodes 262. More specifically, one cell 265 may overlap two electrodes 262, and different polarities may be applied to the electrodes 262 to thereby produce an electric field in the cell 265. The semiconductor light-emitting devices 250 may be assembled into the cell 265 by a magnetic field to be described later and the electric field produced in the cell 265.

The self-assembly apparatus 200 according to the present disclosure may include the magnet 230 that applies a magnetic force to the semiconductor light-emitting devices 250. The magnet 230 may be spaced apart from the chamber 210 to apply a magnetic force to the semiconductor light-emitting devices 250 in the fluid. The magnet 230 may be disposed at an opposite side of the assembly surface of the substrate 260, and its position may be controlled by the position controller 240 that is connected thereto. A position of the position controller 240 may be adjusted by the control unit (not shown) like the transfer unit 220.

More specifically, the magnet 230 may be moved horizontally and vertically from above the chamber 210 by the position controller 240, and rotate clockwise or counterclockwise in a direction horizontal to the substrate 260 during the movement.

Meanwhile, the semiconductor light-emitting devices 250 may move within the fluid along a magnetic field region according to a change of the position of the magnet 230. For this purpose, the semiconductor light-emitting devices 250 may include magnetic materials.

Referring to FIG. 9, the semiconductor light-emitting device 250 may include a first conductive electrode 251, a second conductive electrode 255, a first conductive semiconductor layer 252 on which the first conductive electrode 251 is disposed, a second conductive semiconductor layer 254 overlapping the first conductive semiconductor layer 252 and beneath which the second conductive electrode 255 is disposed, and an active layer 253 disposed between the first and second conductive semiconductor layers 252 and 254.

Here, the first conductive type may be a p-type and the second conductive type may be an n-type, and vice versa is also possible. Also, as described above, the semiconductor light-emitting device 250 may not include an active layer.

In the present disclosure, the first conductive electrode 251 may be formed after the semiconductor light-emitting device 250 is self-assembled onto the substrate 260. Also, in the present disclosure, the second conductive electrode 255 may include a magnetic material. The magnetic material may be a magnetic metal, and include a material corresponding to any one of Ni, SmCo, Gd-based, La-based, and Mn-based material, for example.

The magnetic material may be provided on the second conductive electrode 255 in the form of particles, or may form one layer of the second conductive electrode 255 as shown in FIG. 9. Referring to FIG. 9, the second conductive electrode 255 may include a first layer 255a and a second layer 255b. The first layer 255a may be a layer including a magnetic material, and the second layer 255b may be a layer made of a non-magnetic metal material.

In this implementation, the first layer 255a including the magnetic material may be disposed to be in contact with the second conductive semiconductor layer 254, and the second layer 255b may be a contact metal connected to the electrode of the substrate 260. However, this structure is merely illustrative, and the magnetic material may be disposed on one surface of the first conductive semiconductor layer 252.

Meanwhile, some of the semiconductor light-emitting devices 250 move together in the fluid according to a change in position of the magnet 230 while being adhered to each other by an attractive force between magnetic materials, which causes two or more semiconductor light-emitting devices 250 to be assembled into one cell 255.

In order to prevent this, the self-assembly apparatus 200 according to an implementation of the present disclosure may include vibration generators 270, and the vibration generators 270 may apply vibration to the fluid to separate the semiconductor light-emitting devices 250 from each other. For example, the vibration generator 270 may be provided with a sonicator, an acoustic field generator, or the like, and generate vibration of a predetermined intensity in the fluid at a predetermined interval.

The vibration generators 270 may be provided such that at least portions thereof are in contact with the fluid. The vibration generators 270 may be disposed adjacent to both sides of the substrate 260 (FIGS. 8B and 8C), respectively, or the vibration generators 270 may be integrally formed with the chamber 210 (FIG. 8A). In the latter case, additional vibration generators may be further provided to be located adjacent to both sides of the substrate 260 separately from the chamber 210.

As the vibration generators 270 are provided at both sides of the substrate 260 or employed entirely in the chamber 210, vibration can be applied to the entire fluid. A shape or position of the vibration generator 270 is not particularly limited as long as at least a portion thereof is disposed to be in contact with the fluid.

Also, the vibration generator 270 may generate vibration in the fluid before the substrate 260 is transferred to the assembly position. In detail, vibration of the fluid by the vibration generator 270 may be produced after the semiconductor light-emitting devices 250 are put into the chamber 210 and before the substrate 260 is transferred to the assembly position. Alternatively, vibration may be generated before a magnetic force is applied to the semiconductor light-emitting devices 250 even after the substrate 260 is transferred to the assembly position. The semiconductor light-emitting devices 250 put into the chamber 210 can be initially inhibited from adhering to each other by a surfactant component contained in the fluid. Vibration generated by the vibration generators 270 can prevent the semiconductor light-emitting devices 250 from adhering to each other, and simultaneously separate semiconductor light-emitting devices 250 in a state of being adhered to each other.

The vibration generator 270 may not produce vibration in the fluid during the self-assembly induced by the magnetic field and the electric field. Accordingly, the self-assembly of the semiconductor light-emitting devices 250 on the substrate 260 may not be disturbed or interrupted by the vibration.

According to the present disclosure, the chamber 210 may include channels 211 communicating with a space of the chamber 210 in which the fluid is accommodated. The channels 211 may generate a flow of fluid in the chamber 210 in association or cooperation with movement of the magnet 230. That is, the channels 211 may form a main flow of the fluid in a direction the same as a movement direction of the magnet 230.

In one implementation, the channels 211 may be formed at positions corresponding to both sides of the chamber 210, as illustrated in FIG. 8C, to generate a flow of fluid. For example, the channels 211 may be defined in a direction parallel to an extension direction of the plurality of electrodes 262 formed on the substrate 260. More specifically, as the cells 265 on which the semiconductor light-emitting devices 250 are placed are formed along the extension direction of the plurality of electrodes 262, the magnet 230 may mainly move along the extension direction of the plurality of electrodes 262. Here, the semiconductor light-emitting devices 250 on the fluid move together with the magnet 230 by a magnetic field, and the channels 211 may form the flow of the fluid in the same direction as the movement direction of the magnet 230 to assist the movement of the semiconductor light-emitting devices 250.

Although not illustrated in the drawings, the bottom surface of the chamber 210 may be made of a light transparent material to allow an inside of the chamber 210 to be monitored therethrough. In one implementation, an image sensor (not shown) may be disposed at an outside of the bottom surface of the chamber 210 to observe the assembly surface of the substrate 260. The image sensor (not shown) may be controlled by the control unit, and an inverted type lens, a CCD, or the like may be provided as the image sensor.

The self-assembly apparatus 200 is configured such that the plurality of semiconductor devices 250 can be placed at predetermined positions of the substrate 260 while horizontally and vertically moving by the magnetic field generated by the magnet 230 and the electric field produced by the plurality of electrodes 262 electrically connected to the power supply unit 280. Hereinafter, the assembly process of the semiconductor light-emitting devices 250 using the self-assembly apparatus 200 will be described in more detail.

FIGS. 10A to 10G are views illustrating a process of self-assembling semiconductor light-emitting devices to a substrate using the self-assembly apparatus of FIG. 6.

First, a plurality of semiconductor light-emitting devices 250 each including a magnetic material may be formed through the process described with reference to FIG. 5 before the steps illustrated in FIG. 10.

Figure 10A:
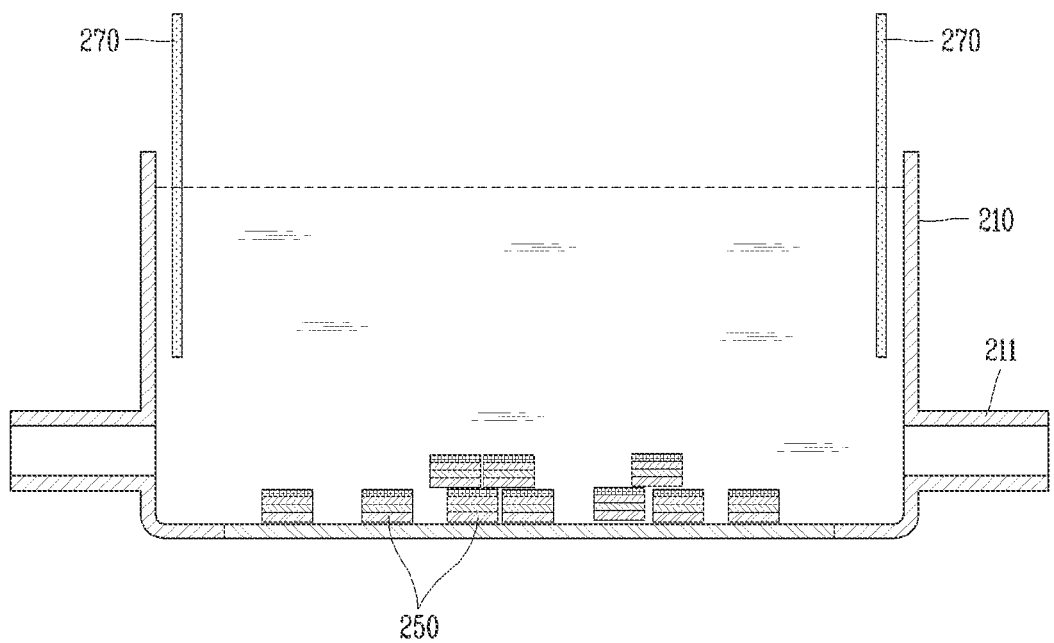
FIGS. 10A to 10G illustrate a process of self-assembling semiconductor light-emitting devices to a substrate using the self-assembly apparatus of FIG. 6.
Figure 10B:
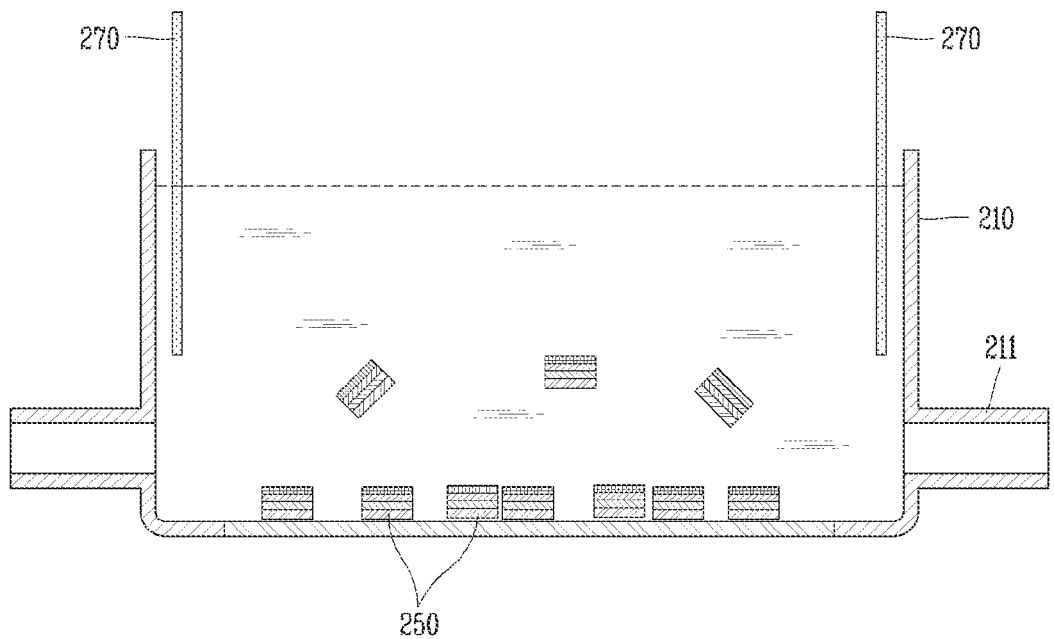
Figure 10C:
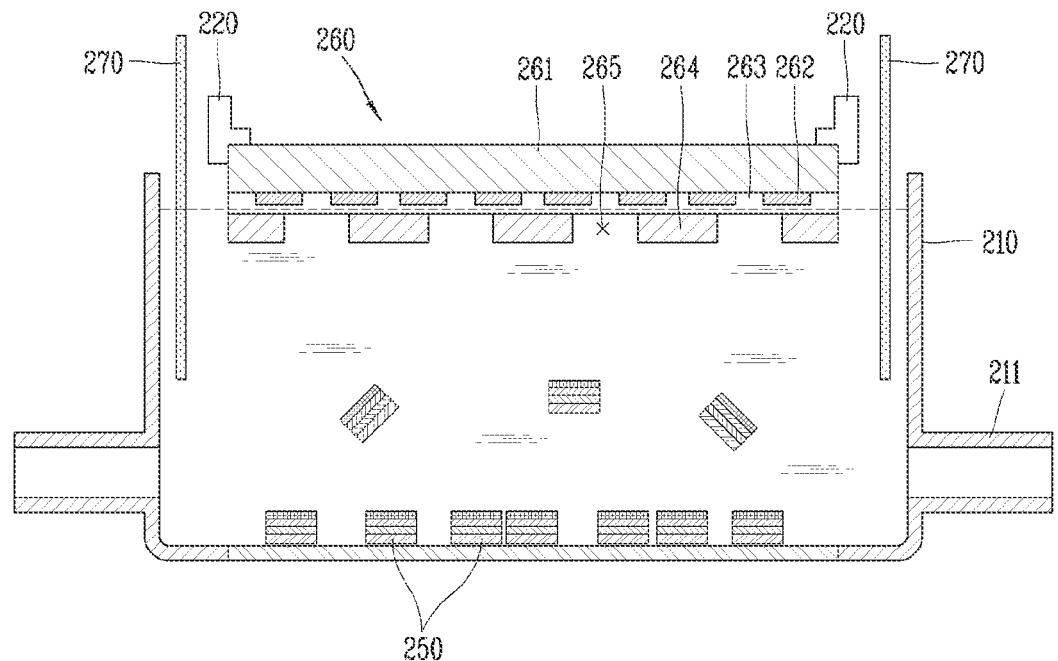

Next, after putting the plurality of semiconductor light-emitting devices 250 including the magnetic materials into the fluid of the chamber 210, vibration may be generated in the fluid (FIGS. 10A and 10B).

The semiconductor light-emitting devices 250 put into the chamber 210 may sink to the bottom of the chamber 210 or some of them may float in the fluid. Some of the semiconductor light-emitting devices 250 may present in the fluid in a state of being adhered to each other (FIG. 10A).

Therefore, after the semiconductor light-emitting devices 250 are put into the chamber 210, vibration is applied before the substrate 260 is transferred to the assembly position to separate the semiconductor light-emitting devices 250 being adhered to each other so as to prepare the next step (FIG. 10B). As long as a magnetic force has not been applied to the semiconductor light-emitting devices 250, vibration can be applied to the fluid even after the substrate 260 is transferred to the assembly position.

For example, a distribution state of the semiconductor light-emitting devices 250 put through the bottom surface of the chamber 210 may be checked, and the intensity of vibration applied to the fluid may be adjusted according to the distribution state. Vibration of a predetermined intensity may be applied to the fluid at a predetermined interval, and the vibration may be applied until the semiconductor light-emitting devices 250 adhered to each other are completely separated.

Next, the substrate 260 on which the semiconductor light-emitting devices 250 are assembled may be transferred to the assembly position (FIG. 10O). As described above, the substrate 260 may be disposed such that the assembly surface on which the semiconductor light-emitting devices 250 are assembled faces downward, namely, the bottom surface of the chamber 210. In addition, at least a portion of the substrate 260 may be submerged in the fluid, and the degree of submersion may vary depending on the degree of bending of the substrate 260, however, at least the assembly surface of the substrate 260 on which the semiconductor light-emitting devices 250 are assembled is disposed to be immersed in the fluid.

Figure 10D:
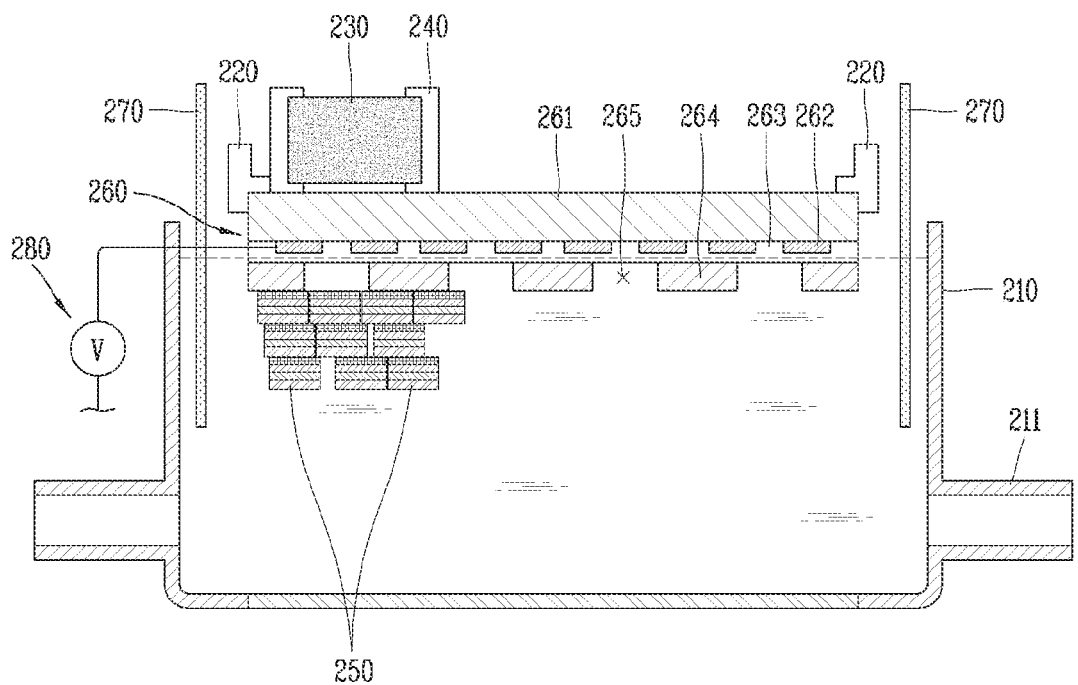

Then, a magnetic force may be applied to the semiconductor light-emitting devices 250 to make them vertically float in the chamber 210 (FIG. 10D). In the self-assembly apparatus 200, when the magnet 230 moves adjacent to an opposite side of the assembly surface of the substrate 260, the semiconductor light-emitting devices 250 in the fluid may float toward the substrate 260.

Meanwhile, a separation distance between the assembly surface of the substrate 260 and the semiconductor light-emitting devices 250 may be controlled by adjusting the magnitude of a magnetic force by the magnet 230, and the separation distance from the outermost surface of the substrate 260 may be several mm to several μm.

Figure 10E:
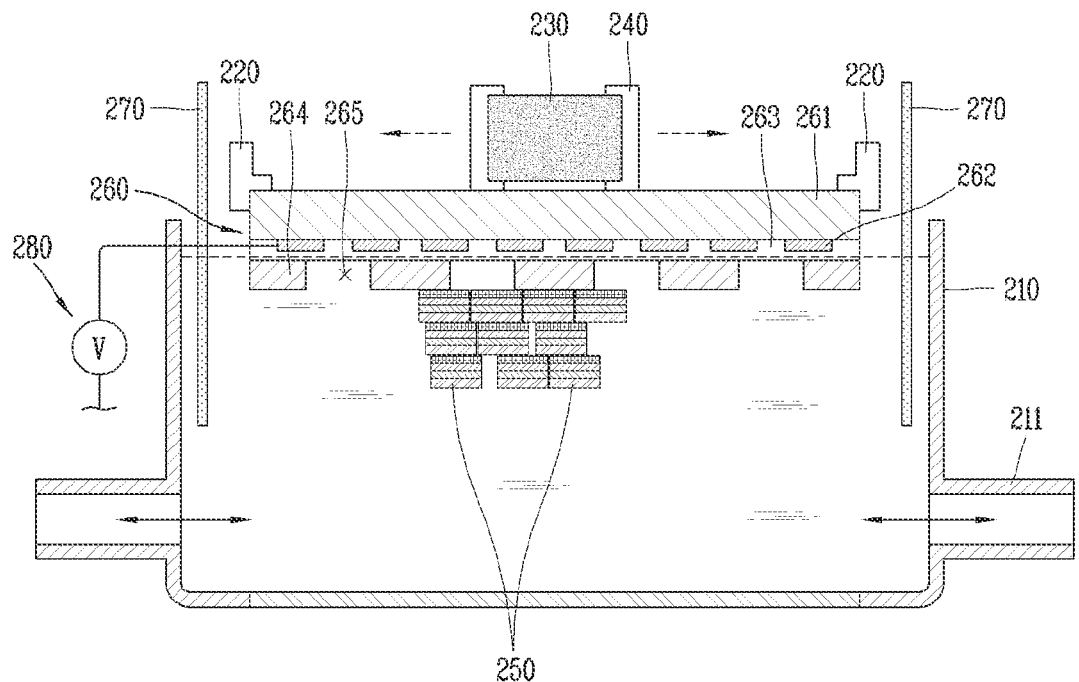

Next, a magnetic force may be applied to the semiconductor light-emitting devices 250, such that the semiconductor light-emitting devices 250 can move along one direction in the chamber 210. The magnetic force may be produced by the magnet 230, and the semiconductor light-emitting devices 250 may move in a direction parallel to the substrate 260 by the magnetic force from a position distant from the substrate 260 (FIG. 10E).

Here, the channels 211 may generate a flow of fluid in association with the movement of the magnet 230. The channels 211 may generate the flow of fluid in the chamber 210 in a direction to which a magnetic force is applied, thereby assisting the movement of the semiconductor light-emitting devices 230. As a result, the assembly speed of the semiconductor light-emitting devices 250 can be improved.

Next, an electric field may be applied to guide the semiconductor light-emitting devices 250 to predetermined positions while moving, such that the semiconductor light-emitting devices 250 can be seated at the predetermined positions of the substrate 260. For example, the semiconductor light-emitting devices 250 moving in a direction horizontal to the substrate 260 by the magnetic force may move in a direction perpendicular to the substrate 260 by the electric field to be placed at the predetermined positions of the substrate 260.

More specifically, power may be selectively supplied to the plurality of electrodes 262 of the substrate 260 to induce or enable the semiconductor light-emitting devices 250 to be assembled only at the predetermined positions. The predetermined positions at which the semiconductor light-emitting devices 250 are seated may be the cells 265 formed on the substrate 260.

When the substrate 260 is a wiring substrate, unloading of the substrate 260 may proceed after the above-described steps to complete the assembly process. If the substrate 260 is an assembly substrate, as described above, a post-process may be performed for transferring the semiconductor light-emitting devices 250 arrayed in the cells 265 of the substrate 260 onto a wiring substrate to achieve a final display device.

Figure 10F:
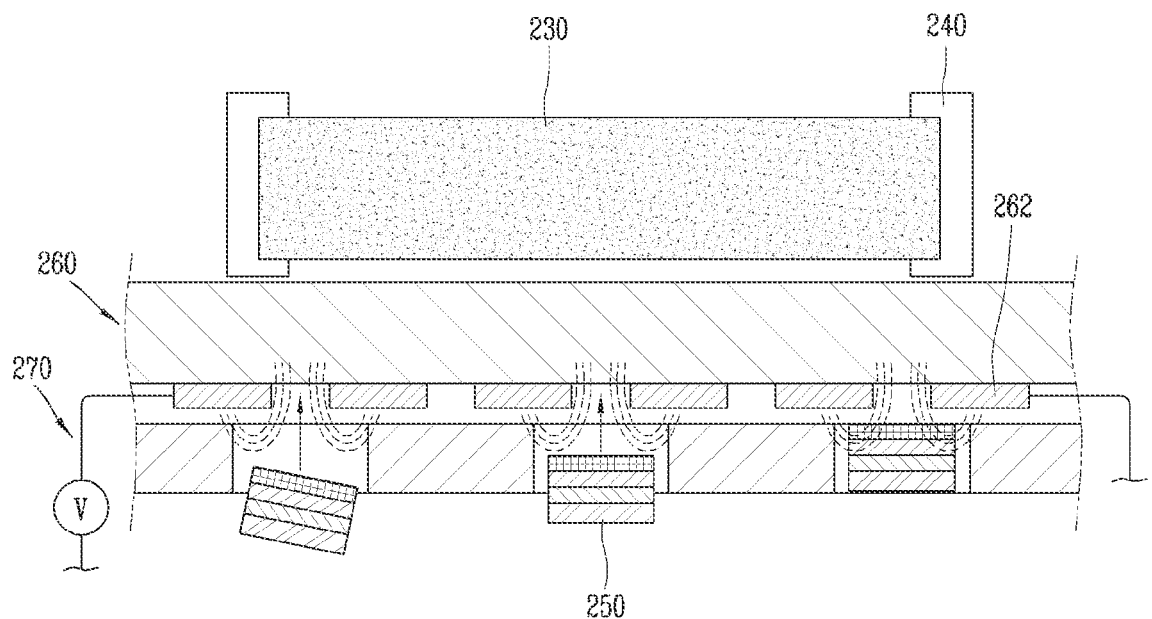
Figure 10G:
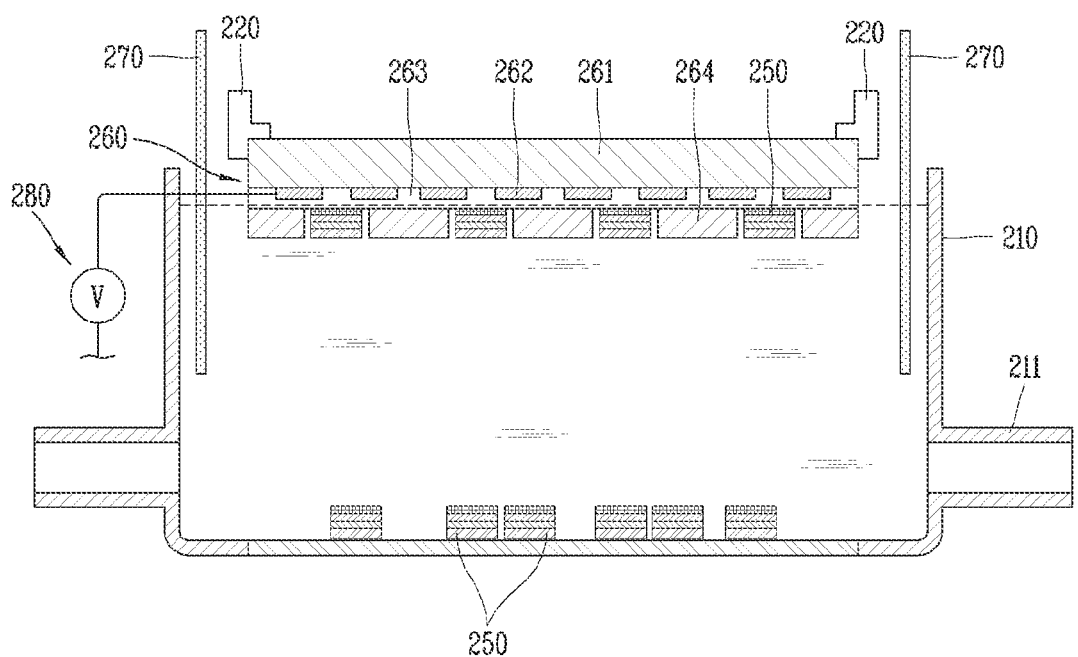

Meanwhile, after guiding the semiconductor light-emitting devices 250 to the predetermined positions of the substrate 260, the magnet 230 may be moved in a direction away from the substrate 260 to drop the remaining semiconductor light-emitting devices 250 to the bottom of the chamber 210 (FIG. 10F).

Then, the semiconductor light-emitting devices 250 left at the bottom of the chamber 210 are collected, and the collected semiconductor light-emitting devices 250 may be reused in another self-assembly process later.

As described above, according to the self-assembly apparatus and method according to the present disclosure, the assembly speed and assembly accuracy can be improved by controlling the distribution and movement of the semiconductor light-emitting devices 250 self-assembled on the substrate 260.

More specifically, the semiconductor light-emitting devices 250 adhered to each other can be separated by vibration generated in the fluid by the vibration generators 270 to thereby prevent two or more semiconductor light-emitting devices 250 from being assembled into one cell 265 formed on the substrate 260. In addition, the channels 211 may generate the flow of fluid along a movement direction of the magnetic force by the magnet 230 to thereby facilitate the movement of the semiconductor light-emitting devices 250.

The present disclosure is not limited to the configuration and the method of the implementations described above, but the implementations may be configured such that all or some of the implementations are selectively combined so that various modifications can be made.

What is claimed is:

1. A self-assembly apparatus for a plurality of semiconductor light-emitting devices, the self-assembly apparatus comprising:
a chamber in which the plurality of semiconductor light-emitting devices and a fluid are accommodated, each semiconductor light-emitting device including a magnetic material;
a transferor configured to transfer a substrate on which the plurality of semiconductor light-emitting devices are to be assembled to an assembly position;
a magnet disposed to be spaced apart from the chamber to apply a magnetic force to the plurality of semiconductor light-emitting devices;
a position controller connected to the magnet and configured to control a position of the magnet; and
a vibration generator disposed such that at least a portion thereof is in contact with the fluid to generate a vibration in the fluid, so as to separate the plurality of semiconductor light-emitting devices from each other while in the fluid,
wherein an electric field is produced in the substrate to allow the plurality of semiconductor light-emitting devices to be assembled at predetermined positions of the substrate while the plurality of semiconductor light-emitting devices are moved according to a change of the position of the magnet, and
wherein the substrate is disposed at the chamber such that an assembly surface thereof on which the plurality of semiconductor light-emitting devices are assembled faces downward, and at least a portion of the substrate is immersed in the fluid.

2. The self-assembly apparatus of claim 1, wherein the substrate includes a plurality of electrodes extending in one direction, and
wherein the electric field is produced in the substrate when power is applied to the plurality of electrodes.

3. The self-assembly apparatus of claim 1, wherein the vibration generator is provided at each of both sides of the substrate to be adjacent to the substrate.

4. The self-assembly apparatus of claim 1, wherein the vibration generator generates vibration in the fluid by using the vibration generator with the substrate in the chamber.

5. The self-assembly apparatus of claim 1, wherein the chamber accommodates the fluid to which a surfactant is added.

6. The self-assembly apparatus of claim 1, wherein a channel communicating with a space in the chamber is formed, and
wherein the channel generates a flow of the fluid in the chamber in association with a movement of the magnet.

7. The self-assembly apparatus of claim 1, wherein the vibration generator is one of a sonicator and an acoustic field generator.

8. The self-assembly apparatus of claim 1, wherein the vibration generator generates the vibration of a predetermined intensity in the fluid at a predetermined interval.

9. A method for self-assembling a plurality of semiconductor light-emitting devices, the method comprising:
putting the plurality of semiconductor light-emitting devices into a chamber in which a fluid is accommodated, each semiconductor light-emitting device including a magnetic material;
transferring a substrate on which the plurality of semiconductor light-emitting devices are to be assembled to an assembly position;
applying a magnetic force to the plurality of semiconductor light-emitting devices to move the plurality of semiconductor light-emitting devices in the chamber along one direction;
applying an electric field to the substrate to guide the plurality of semiconductor light-emitting devices to predetermined positions of the substrate such that the plurality of semiconductor light-emitting devices are assembled at the predetermined positions of the substrate while moving; and
generating a vibration in the fluid to separate the plurality of semiconductor light-emitting devices from each other after putting the plurality semiconductor light-emitting devices into the chamber, wherein the substrate is disposed at the chamber such that an assembly surface thereof on which the plurality of semiconductor light-emitting devices are assembled faces downward, and wherein at least a portion of the substrate is immersed in the fluid.

10. The method of claim 9, wherein the plurality of semiconductor light-emitting devices move in a direction in which the magnetic force is applied, and wherein the method further comprises generating a flow of the fluid in the chamber in the direction in which the magnetic force is applied.

11. The method of claim 9, further comprising:

determining a distribution state of the plurality of semiconductor light emitting devices; and adjusting an intensity of the vibration applied to the fluid according to the distribution state.

12. The method of claim 9, wherein the vibration of a predetermined intensity is applied to the fluid at a predetermined interval, and the vibration is until any of the plurality of semiconductor light-emitting devices that are adhered to each other are completely separated.

13. The method of claim 9, wherein the vibration is generated before the magnetic force is applied to the plurality of semiconductor light-emitting devices.

14. The method of claim 13, wherein the vibration is generated after the substrate is transferred to the assembly position.

15. The method of claim 9, wherein the vibration is generated before the substrate is transferred to the assembly position.

16. A self-assembly apparatus for a plurality of semiconductor light-emitting devices, the self-assembly apparatus comprising:

a chamber to accommodate the plurality of semiconductor light-emitting devices and a fluid, each semiconductor light-emitting device including a magnetic material;

a transferor to transfer a substrate to an assembly position, the substrate including cells in which the plurality of semiconductor light-emitting devices are to be accommodated;

a magnet spaced apart from the chamber to apply a magnetic force to the plurality of semiconductor light-emitting devices in the fluid;

a position controller configured to control a position of the magnet; and a vibration generator having at least a portion in contact with the fluid to generate a vibration in the fluid, and to separate the plurality of semiconductor light-emitting devices from each other while in the fluid via a vibration;

wherein the vibration is generated and the plurality of semiconductor light-emitting devices are put into the chamber and the magnetic force is applied, and wherein the substrate is disposed at the chamber such that an assembly surface thereof on which the plurality of semiconductor light-emitting devices are assembled faces downward, and at least a portion of the substrate is immersed in the fluid.

17. The self-assembly apparatus of claim 16, wherein an electric field is produced in the substrate to allow the plurality of semiconductor light-emitting devices to be accommodated at the cells of the substrate while the plurality of semiconductor light-emitting devices are moved according to a change of the position of the magnet, and wherein the vibration is generated and the electric field is produced.

18. The self-assembly apparatus of claim 16, wherein the vibration generator is one of a sonicator and an acoustic field generator.

* * * * *